(12) United States Patent
Hui et al.

(10) Patent No.: US 11,450,447 B2
(45) Date of Patent: *Sep. 20, 2022

(54) FINE SILVER PARTICLE DISPERSION

(71) Applicant: SOLAR PASTE, LLC, Wilmington, DE (US)

(72) Inventors: Dave Hui, Bristol (GB); Michael Stephen Wolfe, Wilmington, DE (US); Howard David Glicksman, Durham, NC (US); Haixin Yang, Durham, NC (US); Takashi Hinotsu, Tokyo (JP); Shingo Teragawa, Tokyo (JP)

(73) Assignee: SOLAR PASTE, LLC, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/724,392

(22) Filed: Oct. 4, 2017

(65) Prior Publication Data

US 2019/0103200 A1  Apr. 4, 2019

(51) Int. Cl.

| | |
|---|---|
| *H01B 1/22* | (2006.01) |
| *B22F 9/24* | (2006.01) |
| *B05D 3/02* | (2006.01) |
| *H01B 13/00* | (2006.01) |
| *B22F 1/10* | (2022.01) |
| *C22C 5/06* | (2006.01) |
| *C22C 1/04* | (2006.01) |
| *B22F 7/04* | (2006.01) |
| *H05K 1/09* | (2006.01) |
| *B22F 1/102* | (2022.01) |
| *B22F 1/0545* | (2022.01) |

(52) U.S. Cl.
CPC ............. *H01B 1/22* (2013.01); *B05D 3/0254* (2013.01); *B22F 1/10* (2022.01); *B22F 9/24* (2013.01); *H01B 13/0016* (2013.01); *H01B 13/0036* (2013.01); *B22F 1/0545* (2022.01); *B22F 1/102* (2022.01); *B22F 2007/047* (2013.01); *B22F 2301/255* (2013.01); *B22F 2304/05* (2013.01); *B22F 2998/10* (2013.01); *B22F 2999/00* (2013.01); *C22C 1/0466* (2013.01); *C22C 5/06* (2013.01); *H05K 1/097* (2013.01); *H05K 2203/1131* (2013.01)

(58) Field of Classification Search
CPC .................................... H01B 1/02; H01B 1/22
See application file for complete search history.

(56) References Cited

U.S. PATENT DOCUMENTS

| | | | | |
|---|---|---|---|---|
| 6,765,039 | B1 * | 7/2004 | Basak | C09D 11/30 523/160 |
| 2009/0107707 | A1 * | 4/2009 | Yamakawa | H01B 1/16 174/257 |
| 2010/0203130 | A1 * | 8/2010 | Tygesen | A61K 9/205 424/474 |
| 2013/0234191 | A1 * | 9/2013 | Mawatari | H01L 33/60 257/98 |
| 2014/0349025 | A1 | 11/2014 | Hui et al. | |
| 2016/0297982 | A1 * | 10/2016 | Hinotsu | B22F 9/24 |
| 2018/0193913 | A1 * | 7/2018 | Iwai | B22F 1/00 |
| 2019/0119519 | A1 * | 4/2019 | Watanabe | B82Y 30/00 |

FOREIGN PATENT DOCUMENTS

| | | |
|---|---|---|
| CN | 105358261 A | 2/2016 |
| WO | 2017/033911 A1 | 3/2017 |

OTHER PUBLICATIONS

Non-Final Office Action for U.S. Appl. No. 15/724,378; Responsive to Communications Filed on Oct. 4, 2017.

\* cited by examiner

*Primary Examiner* — William D Young
(74) *Attorney, Agent, or Firm* — PV IP PC; Wei Te Chung; Ude Lu

(57) ABSTRACT

This disclosure relates to a method of manufacturing an electrically conductive thick film comprising steps of: (a) applying a fine silver particle dispersion on a substrate, wherein the fine silver particle dispersion comprises, (i) 60 to 95 wt. % of fine silver particles, wherein particle diameter (D50) of the fine silver particles is 50 to 300 nm, (ii) 4.5 to 39 wt. % of a solvent; and (iii) 0.1 to 3 wt. % of a resin, wherein the glass transition temperature (Tg) of the resin is 70 to 300° C., wherein the weight percentages are based on the weight of the fine silver particle dispersion; and (b) heating the applied fine silver particle dispersion at 80 to 1000° C.

6 Claims, No Drawings

FINE SILVER PARTICLE DISPERSION

CROSS REFERENCE TO RELATED APPLICATION

This subject matter of this application is related to that of an application entitled "FINE SILVER PARTICLE DISPERSION" and bearing, that is being filed contemporaneously with this application, and is now U.S. application Ser. No. 15/724,378, filed Oct. 4, 2017. The subject matter of this application and that of U.S. application Ser. No. 15/724,378 was developed in the course of activities undertaken within the scope of a Joint Development Agreement between E.I. duPont de Nemours and Company, owner of the present application, and Dowa Electronics Materials Co., Ltd., owner of U.S. application Ser. No. 15/724,378.

FIELD OF THE INVENTION

The present invention relates generally to a fine silver particle dispersion. More specifically, the invention relates to a fine silver particle dispersion used for forming the conductive thick film of electrical devices.

TECHNICAL BACKGROUND OF THE INVENTION

Fine silver particle dispersions that contain fine silver particles dispersed in a solvent requires quality stability.

US20160297982 discloses a silver particle dispersion. The silver particle dispersion contains fine silver particles (the content of silver in the fine silver particle dispersing solution is 30 to 90% by weight), which have a primary particle diameter of 1 to 100 nm and which are coated with an amine having a carbon number of 8 to 12, such as octylamine, serving as an organic protective material; a polar solvent (5 to 70% by weight) having a boiling point of 150 to 300° C.; and an acrylic dispersing agent (1.5 to 5% by weight with respect to the fine silver particles), such as a dispersing agent of at least one of acrylic acid ester and methacrylic acid ester.

SUMMARY OF THE INVENTION

An objective is to provide a fine silver particle dispersion having preservation stability of resistivity.

An aspect relates to a method of manufacturing an electrically conductive thick film comprising steps of: (a) applying a fine silver particle dispersion on a substrate, wherein the fine silver particle dispersion comprises, (i) 60 to 95 wt. % of fine silver particles, wherein particle diameter (D50) of the fine silver particles is 50 to 300 nm, (ii) 4.5 to 39 wt. % of a solvent; and (iii) 0.1 to 3 wt. % of a resin, wherein the glass transition temperature (Tg) of the resin is 70 to 300° C., wherein the wt. % is based on the weight of the fine silver particle dispersion; and heating the applied fine silver particle dispersion at 80 to 1000° C.

Another aspect relates to a conductive paste comprising a fine silver particle dispersion and a glass frit, wherein the fine silver particle dispersion comprises: (i) 60 to 95 wt. % of fine silver particles, wherein particle diameter (D50) of the fine silver particles is 50 to 300 nm, (ii) 4.5 to 39 wt. % of a solvent; and (iii) 0.1 to 3 wt. % of a resin, wherein the glass transition temperature (Tg) of the resin is 70 to 300° C., wherein the wt. % is based on the weight of the fine silver particle dispersion.

Another aspect relates to a conductive paste comprising a fine silver particle dispersion and an additional silver powder, wherein the fine silver particle dispersion comprises: (i) 60 to 95 wt. % of fine silver particles, wherein particle diameter (D50) of the fine silver particles is 50 to 300 nm, (ii) 4.5 to 39 wt. % of a solvent; and (iii) 0.1 to 3 wt. % of a resin, wherein the glass transition temperature (Tg) of the resin is 70 to 300° C., wherein the wt. % is based on the weight of the fine silver particle dispersion, wherein the particle diameter (D50) of the additional silver powder is 0.4 to 10 µm.

A fine silver particle dispersion that has preservation stability of resistivity can be provided by the present invention.

DESCRIPTION OF THE PREFERRED EMBODIMENTS

Fine Silver Particle Dispersion

A fine silver particle dispersion comprises fine silver particles, a solvent and a resin.

Fine Silver Particles

The fine silver particles are coated with an organic protective material in an embodiment. The organic protective material is an amine with carbon number from 8 to 12 in an embodiment. The amine can be selected from the group consisting of octylamine, nonylamine, decylamine, dodecylamine and a combination thereof in an embodiment. The amine can comprise octylamine in another embodiment. By coating fine silver particles with the amine, it is possible to prevent the sintering of the fine silver particles with each other so as to suitably hold the distance between adjacent fine silver particles.

The particle diameter (D50) of the fine silver particles is 50 to 300 nm, 55 to 250 nm in another embodiment; 75 to 210 nm in another embodiment, 95 to 180 nm in another embodiment. The particle diameter (D50) of the fine silver particles after dispersion in solvent is the $50^{th}$ percentile diameter in a volume-based particle diameter distribution that can be measured by Dynamic Light Scattering (Nanotrac Wave-EX150, NIKKISO CO., LTD.).

The primary particle diameter of the fine silver particles is 1 to 180 nm in an embodiment, 10 to 150 nm in another embodiment, 25 to 110 nm in another embodiment, 30 to 85 nm in another embodiment. The primary particle diameter is measured by analysing an image picture with an image analysis software (A-zo-kun®, Asahi Kasei Engineering Corporation). The image picture can be taken by a scanning electron microscope (SEM) (S-4700, Hitachi Hi-Technologies Corporation) or a transmission electron microscope (TEM) (JEM-1011, Japan Electron Optics Laboratory Ltd.).

The fine silver particle is 60 to 95 wt. %, 65 to 90 wt. % in an embodiment, 68 to 88 wt. % in another embodiment, 70 to 85 wt. % in another embodiment, based on the weight of the fine silver particle dispersion.

Solvent

The fine silver particle is dispersed in a solvent. In an embodiment, boiling point of the solvent is 150 to 350° C., 175 to 310° C. in another embodiment, 195 to 260° C. in another embodiment.

The solvent is selected from the group consisting of diethylene glycol monobutyl ether, diethylene glycol dibutyl ether, diethylene glycol monobutyl ether acetate, terpineol and a mixture thereof in an embodiment.

The solvent is 4.5 to 39 wt. %, 8.5 to 32 wt. % in an embodiment, 10 to 29 wt. % in another embodiment, 12 to 26 wt. % in another embodiment, based on the weight of the fine silver particle dispersion.

Resin

The fine silver particle dispersion comprises 0.1 to 3 wt. % of a resin. The glass transition temperature (Tg) of the resin is 70 to 300° C. The glass transition temperature (Tg) of the resin is 70 to 270° C. in another embodiment, 85 to 250° C. in another embodiment, 97 to 200° C. in another embodiment, 120 to 160° C. in another embodiment.

Molecular weight of the resin is 10,000 to 300,000 in an embodiment, 23,000 to 280,000 in another embodiment, 38,000 to 220,000 in another embodiment, 50,000 to 200,000 in another embodiment. "Molecular weight" is used here as weight-average molecular weight.

The resin is a cellulose resin in an embodiment, a hydroxypropyl cellulose resin (HPC), an ethyl cellulose resin or a mixture thereof in another embodiment, an ethyl cellulose resin in another embodiment.

The ethyl cellulose resins are commercially available from Dow Chemical Company. Examples of ethyl cellulose resins from Dow Chemical Company includes ETHOCEL® brand including STD 4, 7, 10, 14, 20, 45, 100, 200, and 300.

The content of resin is 0.1 to 3 wt. %, 0.2 to 2.9 wt. % in an embodiment, 0.3 to 2.7 wt. % in another embodiment, 0.5 to 2.5 wt. % in another embodiment, based on the weight of the fine silver particle dispersion.

Without being bound by any theory, it is believed that incorporating certain combinations of resin and solvent in a silver particle dispersion enhances the dispersion's stability. In particular, resins and solvents may be evaluated by testing the viscosity of a 10% resin solution wherein resin and solvent are combined in a weight ratio (resin:solvent) of 1:9. In an embodiment, the resin and solvent in the particle dispersion are such that a test 10% resin solution has a viscosity 0.1 to 30 Pa·s. The viscosity of a 10 wt % resin solution is 0.3 to 25 Pa·s in another embodiment, 0.5 to 21 Pa·s in another embodiment, 0.7 to 16 Pa·s in another embodiment. The viscosity of a 10% resin solution is measured by a viscosity measuring apparatus (HAAKE ReoStress 600, Thermo Fisher Scientific Inc.) with HC35/2 cone and plate at shear rate 15.7 $s^{-1}$ at 25° C.

Although not limited to a specific theory, while higher molecular weight resin is preferred since it will provide same solution viscosity at lower polymer solids, too high molecular weight may result in fine silver particle agglomeration.

The fine silver particle dispersion comprises no glass frit in an embodiment.

How to Make Fine Silver Particle Dispersion

The fine silver particle dispersion can be produced by a method comprising the steps of: (i) producing fine silver particles by reducing a silver compound in the presence of an organic protective material such as amine and a reducing agent in water to get a water slurry containing fine silver particles coated with the organic protective material; (ii) removing some of the liquid from the aqueous slurry after decantation to get the fine silver particle; and (iii) adding the concentrated fine silver particle slurry to a resin solution containing at least a solvent and a resin. The fine silver particle dispersion can be further put in a nitrogen atmosphere for 12 hours or more to remove the moisture content therein in an embodiment. The temperature of the atmosphere can be room temperature in an embodiment. The temperature of the atmosphere can be heated to between 80 and 100° C. in another embodiment. The moisture can be removed by heating in another embodiment. A vacuum condition also can be available to remove the moisture in another embodiment.

The silver compound is a silver salt or a silver oxide in an embodiment. The silver salt is silver nitrate ($AgNO_3$) in another embodiment. The silver compound is added so that the concentration of silver ions in the water is in the range of 0.01 to 1.0 mol/L in an embodiment, 0.03 to 0.2 mol/L in another embodiment.

The molar ratio of the organic protective material to silver of the silver compound (organic protective material/Ag) is 0.05 to 6 in an embodiment.

The reduction treatment of the silver compound is carried out at 60° C. or lower in an embodiment, 10 to 50° C. in another embodiment. With such temperature, the fine silver particle can be sufficiently coated with the organic protective material so as to not aggregate. The reaction time in the reduction treatment is 30 minutes or shorter in an embodiment, 10 minutes or shorter in another embodiment.

Any reducing agent can be used as long as it reduces silver. The reducing agent is a basic reducing agent in an embodiment. The reducing agent is hydrazine or sodium borohydride ($NaBH_4$) in another embodiment. The molar ratio of the reducing agent to silver of the silver compound (reducing agent/Ag) is 0.1 to 2.0 in an embodiment.

The fine silver particle dispersion can be further kneaded and degassed by a three-roll mill, a bead mill, a wet jet mill, or an ultrasonic homogenizer in another embodiment.

Viscosity of the fine silver particle dispersion is 30 to 350 Pa·s in another embodiment, 40 to 300 Pa·s in another embodiment, 60 to 280 Pa·s in another embodiment, 80 to 220 Pa·s in another embodiment at shear rate 15.7 $s^{-1}$ at 25° C. The viscosity of the fine silver particle dispersion can be measured by a viscosity measuring apparatus (HAAKE ReoStress 600, Thermo Fisher Scientific Inc.) with HC35/2 cone and plate at shear rate 15.7 $s^{-1}$ at 25° C.

Use of the Fine Silver Particle Dispersion

An electrically conductive thick film can be formed by using the fine silver particle dispersion. The electrically conductive thick film may be used to form a circuit, an electrode or an electrically conductive bonding layer in an embodiment.

A method of manufacturing an electrically conductive thick film comprising steps of: (a) applying a fine silver particle dispersion on a substrate, wherein the fine silver particle dispersion comprises, (i) 60 to 95 wt. % of fine silver particles, wherein particle diameter (D50) of the fine silver particles is 50 to 300 nm, (ii) 4.5 to 39 wt. % of a solvent; and (iii) 0.1 to 3 wt. % of a resin, wherein the glass transition temperature (Tg) of the resin is 70 to 300° C., wherein the wt. % is based on the weight of the fine silver particle dispersion; and heating the applied fine silver particle dispersion at 80 to 1000° C.

There is no restriction on the substrate. The substrate can be a polymer film, a glass substrate, a ceramic substrate, a semiconductor substrate or a metal substrate in an embodiment.

The fine silver particle dispersion is applied by screen printing, inkjet printing, gravure printing, stencil printing, spin coating, blade coating or nozzle discharge in an embodiment. The fine silver particle dispersion is screen printed on a substrate in another embodiment.

The heating temperature is 900° C. or lower in an embodiment, 820° C. or lower in another embodiment, 700° C. or lower in another embodiment, 550° C. or lower in another embodiment, 410° C. or lower in another embodiment, 320° C. or lower in another embodiment, 260° C. or lower in another embodiment. The heating temperature is 95° C. or higher in an embodiment, 120° C. or higher in another embodiment, 140° C. or higher in another embodiment. The heating time is 10 to 200 minutes in an embodiment, 15 to 160 minutes in another embodiment, 25 to 120 minutes in another embodiment, 40 to 95 minutes in another embodiment, 48 to 80 minutes in another embodiment. The fine silver particle can be sufficiently sintered during heating with the temperature and time described above.

The electrically conductive thick film is 1 to 100 μm thick in an embodiment, 8 to 85 μm thick in another embodiment, 15 to 65 μm thick in another embodiment, 19 to 55 μm thick in another embodiment, 24 to 48 μm thick in another embodiment.

An electrical device comprises one or more electrically conductive thick film manufactured using the present composition. The electrical device is selected from the group consisting of a solar cell, an LED, a display, a power module, a chip resistor, a chip conductor, a filter, an antenna, a wireless charger, a capacitive sensor and a haptic device in an embodiment.

Electrically Conductive Paste

The fine silver particle dispersion can be used to form an electrically conductive paste in an embodiment. The electrically conductive paste comprises a fine silver particle dispersion and a glass frit in an embodiment. The glass frit could promote sintering of the fine silver particle and adhere to the substrate during firing.

Particle diameter (D50) of the glass frit can be 0.1 to 7 μm in an embodiment, 0.3 to 5 μm in another embodiment, 0.4 to 3 μm in another embodiment, 0.5 to 1 μm in another embodiment. The particle diameter (D50) is obtained as described above with regard to the conductive powder.

In an embodiment, softening point of the glass frit can be 310 to 600° C., in another embodiment 350 to 500° C., in another embodiment, 410 to 460° C. When the softening point is in the range, the glass frit can melt properly to obtain the effects mentioned above. Here, the "softening point" is the softening point obtained by the fiber elongation method of ASTM C338-57.

The chemical composition of the glass frit here is not limited. Any glass frits suitable for use in the electrically conductive paste is acceptable. The glass frit comprises a lead silicate glass frit, a lead boronsilicate glass frit, a lead tellurium glass frit, a zinc borosilicate glass frit, a lead-free bismuth boron glass frit or a mixture thereof in an embodiment.

The amount of the glass frit can be determined based on the amount of the fine silver particle. The weight ratio of the fine silver particle and the glass frit (fine silver-particle: glass-frit) can be 10:1 to 100:1 in an embodiment, 25:1 to 80:1 in another embodiment, 30:1 to 68:1 in another embodiment, 42:1 to 53:1 in another embodiment. With such amount of the glass frit, sintering a conductive powder and adhesion between an electrode and a substrate can be sufficient.

The glass frit is 0.5 to 8 parts by weight in an embodiment, 0.8 to 6 parts by weight in another embodiment, 1.0 to 3 wt % parts by weight in another embodiment based on 100 parts by weight of the conductive paste.

The electrically conductive paste comprises the fine silver particle dispersion and an additional silver powder in another embodiment. The additional silver powder could increase conductivity of a formed electrode.

The particle diameter (D50) of the additional silver powder is 0.4 to 10 μm in an embodiment, 0.6 to 8 μm in another embodiment, 0.8 to 5 μm in another embodiment, 1 to 3 μm in another embodiment.

The particle diameter (D50) of the additional silver powder is determined from a measured distribution of the particle diameters by using a laser diffraction scattering method. Microtrac model X-100 is an example of a commercially-available device useful in carrying out particle size distribution measurements.

The additional silver powder is flaky or spherical in shape in an embodiment.

The additional silver powder is 10 to 60 parts by weight in an embodiment, 18 to 53 parts by weight in another embodiment, 26 to 49 parts by weight in another embodiment based on 100 parts by weight of the conductive paste.

The electrically conductive paste comprises the fine silver particle dispersion, the glass frit and the additional silver powder in another embodiment.

Use of the Electrically Conductive Paste

The electrically conductive thick film can be formed by using the conductive paste. The electrically conductive thick film may form a circuit, an electrode or a electrically conductive bonding layer as described above in an embodiment.

A method of manufacturing an electrically conductive thick film comprising the steps of: (a) applying a conductive paste on a substrate, wherein the conductive paste comprises a fine silver particle dispersion and a glass frit, wherein the fine silver particle dispersion comprises (i) 60 to 95 wt. % of fine silver particles, wherein particle diameter (D50) of the fine silver particles is 50 to 300 nm, (ii) 4.5 to 39 wt. % of a solvent; and (iii) 0.1 to 3 wt. % of a resin, wherein the glass transition temperature (Tg) of the resin is 70 to 300° C., wherein the wt. % is based on the weight of the fine silver particle dispersion; and (b) firing the applied conductive paste at 600 to 1000° C. The conductive paste used in the method of manufacturing an electrically conductive thick film can comprise an additional silver powder instead of or together with the glass frit in another embodiment.

The substrate is a glass substrate, a ceramic substrate or a semiconductor substrate in an embodiment. The conductive paste is applied by screen printing, inkjet printing, gravure printing, stencil printing, spin coating, blade coating or nozzle discharge in an embodiment. The conductive paste is screen printed on a substrate in another embodiment.

The firing temperature is 920° C. or lower in an embodiment, 880° C. or lower in another embodiment, 830° C. or lower in another embodiment, 780° C. or lower in another embodiment. The firing temperature is 650° C. or higher in an embodiment, 700° C. or higher in another embodiment. The firing time is 5 seconds or longer in an embodiment, 30 seconds or longer in another embodiment, 1 minute or longer in another embodiment, 7 minutes or longer in another embodiment, 15 minutes or longer in another embodiment, 25 minutes or longer in another embodiment. The firing time is 200 minutes or shorter in an embodiment, 160 minutes or shorter in another embodiment, 110 minutes or shorter in another embodiment, 95 minutes or shorter in another embodiment, 75 minutes or shorter in another embodiment.

EXAMPLE

The present invention is illustrated by, but is not limited to, the following examples.

Example 1 to 3

Pure water 3422 g as a reaction medium was put in a 5 L reaction vessel and the temperature was adjusted to 40° C. Octylamine as an organic protective material 51.1 g and 80% hydrazine hydrate as a reducing agent 6.2 g were added to the reaction vessel. The molar ratio of octylamine to silver (octylamine/Ag) was 2. The molar ratio of hydrazine hydrate to silver (hydrazine hydrate/Ag) was 0.5. The mixture in the vessel was stirred at 345 rpm with a stirring rod having impellers. Nitrogen gas as an inert gas was blown into the vessel at a flow rate of 2 L/min. An aqueous solution of 33.6 g of a silver nitrate (Toyo Kagaku Inc.) dispersed in 130 g of pure water was added to the reaction vessel. A water dispersion containing fine silver particles coated with octylamine was obtained by stirring the mixture in the reaction vessel for another two minutes.

To measure the primary particle diameter of the fine silver particles made above, a few drops of the water dispersion were placed on a glass plate. The water dispersion on the glass plate was dried at 60° C. so that the fine silver particles remained. An image picture of the fine silver particles remained on the glass plate was taken by a scanning electron microscope (SEM) (S-4700 produced by Hitachi Hi-Technologies Corporation) at 50,000-times magnification and analyed by image analysis software (A-zo-kun®, Asahi Kasei Engineering Corporation). The diameters of more than 100 primary particles were measured and their average, or their average primary-particle diameter, was obtained. SEM images with many aggregated particles and irregular-shaped particles were determined to be immeasurable.

The wet fine silver particles in the water dispersion were collected by decantation where most of the liquid was removed after fine silver particles sedimention.

An ethyl cellulose resin (ETHOCEL™ STD 10, Mw: 77,180, Tg: 130° C., Dow Chemical Company) was dissolved in diethylene glycol monobutyl ether (DGBE) and stirred for 6 hours at 60° C. by a magnetic stirrer. The stirring speed was 1000 rpm. Diethylene glycol monobutyl ether was a polar solvent having a boiling point of 230° C. and a solubility parameter value of 9.5.

The wet fine silver particles obtained above were dispersed in the ethyl cellulose resin solution. The fine silver particle dispersion was obtained by drying the mixture of the wet fine silver particles and the resin solution at room temperature in nitrogen atmosphere for 24 hours to remove the water therein. The amount of each component of the fine silver particle dispersion is shown in Table 1.

The fine silver particle dispersion obtained above was further mixed and degassed by a three-roll mill. Viscosity of the fine silver particle dispersion was measured by a viscosity measuring apparatus (HAAKE RheoStress 600, Thermo Fisher Scientific Inc.) with HC35/2 cone and plate at shear rate 15.7 s$^{-1}$ at 25° C. The particle diameter (D50) of the fine silver particles was measured by Dynamic Light Scattering (Nanotrac Wave-EX150, NIKKISO CO., LTD.). A 10,000-fold dilution of the fine silver particle dispersion was made by adding diethylene glycol monobutyl ether to the fine silver particle dispersion followed by sonication with an ultrasonic probe. The 10,000-fold dilution of the fine silver particle dispersion was used for the particle diameter (D50) measurement. The results are shown in Table 1.

Separately the 10 wt % resin solution was prepared by dissolving the resin 10 parts by weight in the solvent 90 parts by weight. The 10 wt % resin solution's viscosity (Pa·s) was measured by a viscosity measuring apparatus (HAAKE ReoStress 600, Thermo Fisher Scientific Inc.) with HC35/2 cone and plate at shear rate 15.7 s$^{-1}$ at 25° C. The results are shown in Table 1.

The fine silver particle dispersion was preserved at room temperature of 25° C. for 100 days in order to see preservation stability at a room temperature. On day 5 and day 100, a conductive thick film was formed by metal mask-printing the preserved fine silver particle dispersion on a glass substrate. The conductive thick film was then heated at 150° C. for 60 minutes in a hot-air dryer (DKM400, Yamato Scientific Co., Ltd.). The printing pattern was a square of 10 mm long, 10 mm wide and 30 µm thick. The fine silver particles were sintered during heating.

Resistivity of the heated conductive thick film was measured by a surface resistance measuring apparatus (MCP-T610, Mitsubishi Chemical Analytech), and the film thickness was measured using a thickness measuring apparatus (SURFCOM 1500DX, Toyo Precision Parts MFG Co., Ltd.). The results are shown in Table 1.

The resistivity on day 100 was comparable to the resistivity on day 5 as the initial measured resistivity in Examples 1 to 3, indicating good stability.

TABLE 1

|  |  | Example 1 | Example 2 | (wt. %) Example 3 |
|---|---|---|---|---|
| Ag Powder |  | 74.1 | 80.8 | 84.7 |
| DGBE solvent |  | 23.5 | 17.4 | 14.4 |
| Ethyl cellulose resin |  | 2.4 | 1.8 | 0.9 |
| Resin (Tg) |  | 130° C. | 130° C. | 130° C. |
| Dispersion viscosity* |  | 104 Pa · s | 197 Pa · s | 257 Pa · s |
| Resin solution viscosity** |  | 1.0 Pa · s | 1.0 Pa · s | 1.0 Pa · s |
| Particle diameter (D50) |  | 121 nm | 130 nm | 124 nm |
| Resistivity | Day 5 | 6.9 | 7.7 | 8.4 |
| (µohm · cm) | Day 100 | 5.3 | 5.5 | 5.3 |

*Viscosity of the fine silver particle dispersion
**Viscosity of the 10% resin solution.

Example 4 to 8

Other resin and solvent were examined. The conductive thick film was formed in the same manner as Example 1 except for using a different resin, hydroxypropylcellulose (HPC) or a different solvent terpineol (TPO) or diethylene glycol monobutyl ether acetate (DGBA) as shown in Table 2. Glass transition temperature (Tg) of HPC was 105° C. TPO was a polar solvent having boiling point of 219° C. and solubility parameter value of 19.1 MPa$^{1/2}$. DGBA was a polar solvent having boiling point of 247° C. and solubility parameter value of 18.5 MPa$^{1/2}$. Viscosity of the fine silver particle dispersion, viscosity of a 10 wt % of resin solution and particle diameter (D50) were measured as described with regard to Example 1. The results are shown in Table 2.

The resistivity of the conductive thick film after the 10-day preservation was measured on day 1 and day 10 by the same method as in Example 1. The resistivity on day 10 did not increase much from the resistivity on day 1 in each of the Examples 4 to 8.

TABLE 2

| | Ex. 4 | Ex. 5 | Ex. 6 | Ex. 7 | (wt. %) Ex. 8 |
|---|---|---|---|---|---|
| Ag Powder | 72.0 | 81.1 | 81.1 | 80.5 | 80.7 |
| TPO solvent | 0 | 17.6 | 18.2 | 0 | 0 |
| DGBA solvent | 0 | 0 | 0 | 18.2 | 18.6 |
| DGBE solvent | 27.1 | 0 | 0 | 0 | 0 |
| HPC resin | 0.8 | 0 | 0 | 0 | 0 |
| Ethyl cellulose resin | 0 | 1.3 | 0.7 | 1.3 | 0.7 |
| Dispersion viscosity* | 81 Pa·s | 228 Pa·s | 157 Pa·s | 288 Pa·s | 161 Pa·s |
| Resin solution viscosity** | 10.7 Pa·s | 9.5 Pa·s | 9.5 Pa·s | 1.2 Pa·s | 1.2 Pa·s |
| Particle diameter (D50) | 124 nm | 59 nm | 60 nm | 144 nm | 153 nm |
| Resistivity Day 1 | 3.9 | 3.5 | 3.3 | 3.1 | 3.3 |
| (µohm·cm) Day 10 | 4.0 | 3.9 | 3.5 | 3.2 | 3.2 |

*Viscosity of the fine silver particle dispersion
**Viscosity of the 10% resin solution Reference 1 to 4

Conductive thick films were formed in the same manner as Example 1 except for using different molecular weights (Mw) of ethyl cellulose as shown in Table 3. The glass transition temperature of the hydroxypropyl cellulose resin (HPC) was 105° C. Viscosity of the fine silver particle dispersion, viscosity of a 10 wt % of resin solution and particle diameter (50) were measured as described with regard to Example 1. The results are shown in Table 3.

The resistivity of the conductive thick film was measured right after heating with the same method as in Example 1. The results are shown in Table 3. The resistivity was sufficiently low in all Reference (Ref.) 1 to 4.

TABLE 3

| | Ref. 1 | Ref. 2 | Ref. 3 | (wt. %) Ref. 4 |
|---|---|---|---|---|
| Ag Powder | 80.3 | 80.6 | 73.8 | 73.0 |
| Solvent | 18.5 | 18.7 | 24.7 | 25.8 |
| STD 4 (Mw: 44,046) | 1.2 | 0 | 0 | 0 |
| STD 20 (Mw: 105,059) | 0 | 0.7 | 0 | 0 |
| STD 45 (Mw: 135,021) | 0 | 0 | 1.5 | 0 |
| STD 100 (Mw: 180,000) | 0 | 0 | 0 | 1.2 |
| Dispersion viscosity* | 107 Pa·s | 169 Pa·s | 75 Pa·s | 68 Pa·s |
| Resin solution viscosity** | 0.3 Pa·s | 2.2 Pa·s | 5.9 Pa·s | 19.0 Pa·s |
| Particle diameter (D50) | 162 nm | 101 nm | 123 nm | 175 nm |
| Resistivity (µohm·cm) | 10 | 7 | 4 | 6 |

*Viscosity of the fine silver particle dispersion
**Viscosity of the 10% resin solution Comparative Example 1 and 2

The conductive thick film was formed in the same manner as Example 1 except for using a different resin, an acrylic resin or isobutyl methacrylate resin as shown in Table 4. Both the acrylic resin and the isobutyl methacrylate resin had glass transition temperature (Tg) of 50° C. In Comparative Example 1 and 2, the resistivity was measured in the same manner as Example 1 on day 5 or 1 as the initial measurement and on day 100.

The results are shown in Table 4. The resistivity was already over 27 µohm·cm on day 5 and increased to unmeasurably high resistivity on day 100 in Comparative Example 1. The resistivity increased to one-and-a-half times higher on day 100 from that on day 5 in Comparative Example 2.

TABLE 4

| | Comparative Example 1 | (wt. %) Comparative Example 2 |
|---|---|---|
| Ag Powder | 86.2 | 74.1 |
| Solvent | 11.2 | 23.6 |
| Acrylic resin | 2.6 | 0 |
| Isobutyl methacrylate resin | 0 | 2.3 |
| Dispersion viscosity* | 71 Pa·s | 3.1 Pa·s |
| Resin solution viscosity** | 0.01 Pa·s | 0.02 Pa·s |
| Particle diameter (D50) | 60 nm | 147 nm |
| Resistivity Day 1 | 12.9 | 5.6 |
| (µohm·cm) Day 100 | Unmeasurably high | 8.5 |

*Viscosity of the fine silver particle dispersion
**Viscosity of the 10% resin solution

What is claimed is:

1. A method of manufacturing an electrically conductive thick film comprising steps of:
   (a) applying a fine silver particle dispersion on a substrate, wherein the fine silver particle dispersion comprises no glass frit, wherein the fine silver particle dispersion comprises,
      (i) 80.8 to 84.7 wt % of fine silver particles, wherein particle diameter (D50) of the fine silver particles is 50 to 300 nm;
      (ii) 14.4-17.4 wt % of a solvent, wherein the solvent is selected from the group consisting of diethylene glycol monobutyl ether, diethylene glycol dibutyl ether, diethylene glycol monobutyl ether acetate, and a mixture thereof; and
      (iii) 0.9 to 1.8 wt % of an ethyl cellulose resin having a weight-average molecular weight of 23,000 to 300,000, wherein the weight percentages are based on the weight of the fine silver particle dispersion, and wherein the resin and the solvent are such that a viscosity of a mixture of the resin and the solvent at a weight ratio (resin:solvent) of 1:9 is 0.1 to 30 Pa•s; and
   (b) sintering the applied fine silver particle dispersion at 95 to 410° C.

2. The method of claim 1, wherein the fine silver particles are coated with an organic protective material.

3. The method of claim 2, wherein the organic protective material is an amine with carbon number from 8 to 12.

4. The method of claim 1, wherein boiling of the solvent is 150 to 350° C.

5. The method of claim 1, wherein molecular weight of the resin is 38,000 to 280,000.

6. The method of claim 1, wherein viscosity of the fine silver particle dispersion is 30 to 350 Pa·s.

* * * * *